United States Patent [19]

Yui

[11] Patent Number: 4,885,601
[45] Date of Patent: Dec. 5, 1989

[54] APPARATUS FOR DEVELOPING IMAGING SHEETS EMPLOYING PHOTOSENSITIVE MICROCAPSULES

[75] Inventor: Yasuji Yui, Saitama, Japan

[73] Assignee: Sony Corporation, Tokyo, Japan

[21] Appl. No.: 248,373

[22] Filed: Sep. 23, 1988

[30] Foreign Application Priority Data

Oct. 27, 1987 [JP] Japan .................................. 62-270758

[51] Int. Cl.$^4$ ........................ G03B 27/32; G03B 27/52
[52] U.S. Cl. ..................................... 355/27; 354/297
[58] Field of Search ................... 355/27, 28; 354/297, 354/301–304, 319; 430/138; 346/108, 76 L

[56] References Cited

U.S. PATENT DOCUMENTS 4,648,699 3/1987 Holycross et al. ................... 354/297

Primary Examiner—Richard A. Wintercorn
Attorney, Agent, or Firm—Alvin Sinderbrand Curtis, Morris & Safford

[57] ABSTRACT

In an apparatus that employs a photo-sensitive sheet with a surface comprised of photo-sensitive microcapsules containing pigments or precursors thereof and which are selectively hardened when irradiated with a light image of a picture to be developed on a sheet of developing paper by the pressing together of the developing paper and the photo-sensitive sheets; the developing paper and photo-sensitive sheets in contact with each other are transported in a predetermined direction of sheet travel across a back-up surface, and a rotatable roller disposed in opposing relation to the back-up surface and having its axis of rotation extending parallel to the direction of sheet travel is transported relative to the back-up surface in a direction parallel to the latter which is perpendicular to the direction of sheet travel while the roller is urged toward the back-up surface with the contacting developing paper and photo-sensitive sheets therebetween so as to be pressed together at a relatively narrow striped-like area defined by the rolling path of the peripheral surface of the roller.

14 Claims, 6 Drawing Sheets

APPARATUS FOR DEVELOPING IMAGING SHEETS EMPLOYING PHOTOSENSITIVE MICROCAPSULES

BACKGROUND OF THE INVENTION

1. Field Of The Invention

The present invention relates generally to developing apparatus, and more particularly is directed to an apparatus for developing an image or picture on a sheet of developing paper from a photo-sensitive sheet of the type having a coating of photo-sensitive microcapsules.

2. Description Of The Prior Art

It is known, for example, as disclosed in Japanese Laid-Open Patent Gazette No. 59-30537, to print or develop an image of a color picture on a sheet of printing or developing paper from a photo-sensitive sheet having a coating of photo-sensitive microcapsules which has been irradiated with a light image of the picture. This known printing method employs, as the photo-sensitive sheet, a base made of a suitable resin on which there is coating of uniformly distributed yellow, magenta and cyan microcapsules. Each of the yellow, magenta and cyan microcapsules has an outer shell of a relatively soft material in which there is sealed an optically-hardening composition. The optically-hardening composition of each microcapsule contains a respective pigment or a precursor thereof. When the photo-sensitive microcapsules are irradiated with respective wave lengths of light the optically-hardening compositions therein are hardened. For example, the irradiation with blue light hardens the yellow microcapsules containing the precursor of yellow pigment, the irradiation with green light hardens the magenta microcapsules containing the precursor of magenta pigment, and the irradiation with red light hardens the cyan microcapsules containing the precursor of cyan pigment.

It will be appreciated that, when irradiating the above described photo-sensitive sheet with a light image of a color picture, the light of the color picture is suitable analyzed into the three primary colors of red, green and blue and the photo-sensitive sheet is irradiated separately with a red light image, a green light image and a blue light image by which the cyan, magenta and yellow microcapsules, respectively, are hardened in accordance with those images. After such irradiation of the photo-sensitive sheet, the latter is passed, in contact with a sheet of developing paper, through the nip between rotating pressure rollers which rotate about axes of right angles to the direction of sheet travel, and which extend across the full width of the sheet. The resulting pressure ruptures the shells of the yellow, magenta and cyan microcapsules that were not substantially hardened by irradiation with light of corresponding wave lengths. The substances containing precursors of pigments are transferred from the ruptured microcapsules to the facing surface of the sheet of developing paper which contains substances for developing the respective color pigment from the precursor thereof. Thus, the transferred precursors of pigments from the yellow, magenta and cyan microcapsules are suitably mixed to present a developed or printed color picture on the sheet of developing paper.

When the photo-sensitive sheet and the sheet of developing paper are pressed together between rollers rotating about axes at right angles to the direction of sheet travel therebetween, very large forces have to be exerted for urging together the rollers. More specifically, in order to rupture the unhardened microcapuules of the photo-sensitive sheet and to ensure adequate contact of the released pigment precursors with the developing substances on the sheet of developing paper, it is necessary that the photo-sensitive sheet and the sheet of developing paper be urged against each other with a pressure of 30 to 40 kg/mm$^2$ In the case where, for example, the picture is to be printed on a sheet of developing paper of A4 size which has a width of 21 cm, and the rollers employed for pressing together the photo-sensitive sheet and the sheet of developing paper each have a diameter of 50 mm, the force urging the rollers together has to be about 57 kg for each cm of roller length, that is, a total force of 1200 kg for rollers having lengths of 21 cm. However, a developing apparatus capable of applying such a large force for urging together the rollers must be large and relatively complex in construction.

In order to solve the foregoing problem, it has been previously proposed, for example, as disclosed in Japanese Patent Application No. 62-93879, having a common assignee herewith, to provide a developing apparatus employing a dot impact head for applying pressure to microcapsules so as selectively rupture the latter in accordance with the selective optical-hardening thereof and to transfer the respective precursors of pigments to a sheet of developing paper. In such developing apparatus, the dot impact head is moved in a predetermined path or pattern and, at any time, applies impacts to only very small incremental areas of the photo-sensitive sheet so that the pressure required for rupturing the unhardened microcapsules can be achieved with the exertion of a relatively small force by the dot impact head. However, this developing apparatus has the disadvantage of being objectionably noisy when in use, and the useful life of the dot impact head is short.

OBJECTS AND SUMMARY OF THE INVENTION

Accordingly, it is an object of the present invention to provide an improved developing apparatus for printing or developing a picture on a sheet of developing paper from a photo-sensitive sheet having a coating of photo-sensitive microcapsules, and which avoids the above mentioned disadvantages of the prior art.

More specifically, it is an object of the present invention to provide a developing apparatus of the described type which can achieve printing or developing of a color picture of excellent clarity and color fidelity.

It is another object of the present invention to provide a developing apparatus, as aforesaid, of relatively simple construction, and which can be made compact in size.

It is still another object of the present invention to provide a developing apparatus, as aforesaid, which is not noisy in operation.

In accordance with an aspect of this invention, an apparatus for developing a picture on a sheet of developing paper from a photo-sensitive sheet upon the pressing together of the photo-sensitive and developing paper sheets, comprises means defining a back-up surface; means for transporting the developing paper and photo-sensitive sheets in contact with each other in a predetermined direction of sheet travel across the back-up surface; a rotatable roller disposed in opposing relation to the back-up surface and having an axis of rotation extending parallel to the direction of sheet travel;

means mounting the roller for bodily movements toward and away from the back-up surface and parallel to the back-up surface in directions perpendicular to the direction of sheet travel; and means for transporting the roller relative to the back-up surface in one of said directions perpendicular to the direction of sheet travel while urging the roller toward the back-up surface with the developing paper and photo-sensitive sheets being in contact with each other between the roller and back-up surface so as to be pressed together thereby.

The above, and other objects, features and advantages of the present invention, will be apparent from the following detailed description of preferred embodiments when read in conjunction with the accompanying drawings, in which corresponding parts are identified by the same reference numerals in the several views.

DETAILED DESCRIPTION OF THE PREFERRED EMBODIMENTS

Figure 1:
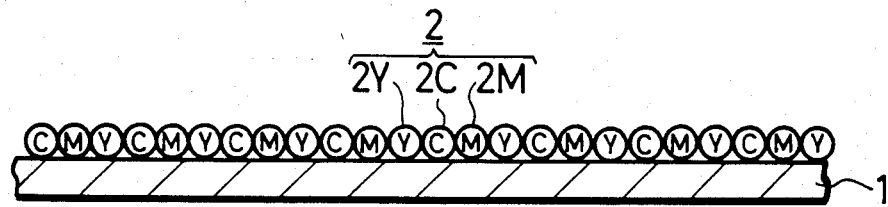
FIG. 1 is a schematic sectional view illustrating a known photo-sensitive sheet having a coating of photo-sensitive microcapsules, and which is of a type adapted for use in a developing apparatus embodying the present invention.

Referring to the drawings in detail, and initially to FIG. 1, there is shown a known type of photo-sensitive sheet 1, for example, as disclosed in Japanese Laid-Open Patent Gazette No. 59-30537, which is suitable for use in an apparatus according to the present invention for printing or developing an image of a color picture on a sheet 3 of developing paper. The photo-sensitive sheet 1 generally comprises a base sheet of a suitable resin, such as, polyethylene terephthalate resin, polypropylene resin, polyamide resin or the like, to which there is applied a coating or layer 2 of uniformly distributed yellow, magenta and cyan microcapsules 2Y, 2M and 2C, respectively. Each of the microcapsules 2Y, 2M and 2C has an outer shell of a relatively soft material, such as, gelatin, polyvinyl alcohol, gum arabic or the like, and which contains an optically-hardening composition which includes a respective pigment or a precursor thereof, such as, a photochromic dye, electrochromic dye, a leuco dye or the like, and an ethylene-based unsaturated compound or the like. When the yellow, magenta and cyan microcapsules 2Y, 2M and 2C are irradiated with blue light, green light and red light, respectively, the optically-hardening compositions therein are hardened and, hence, the microcapsules 2Y, 2M and 2C become sufficiently hard to resist the rupturing thereof.

Figure 2:
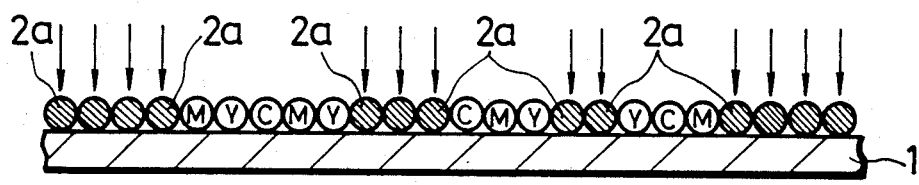
FIG. 2 is a schematic sectional view similar to that of FIG. 1, but illustrating the exposed state of the photo-sensitive sheet.

When employing the above described photo-sensitive sheet 1, for printing or developing a color picture, the light of the color picture is suitably analyzed into the three primary colors of red, green and blue and the photo-sensitive sheet is irradiated separately with a red light image, a green light image and a blue light image by 2Y, respectively, are selectively hardened, as indicated at 2a on FIG. 2, in accordance with the distribution of light in each of such primary color images.

After the photo-sensitive sheet 1 is thus exposed for selectively hardening its microcapsules, a picture is developed therefrom on a sheet of developing paper by pressing together the sheet of developing paper and the exposed photo-sensitive sheet so as to rupture those microcapsules which have not been hardened.

Figure 3:
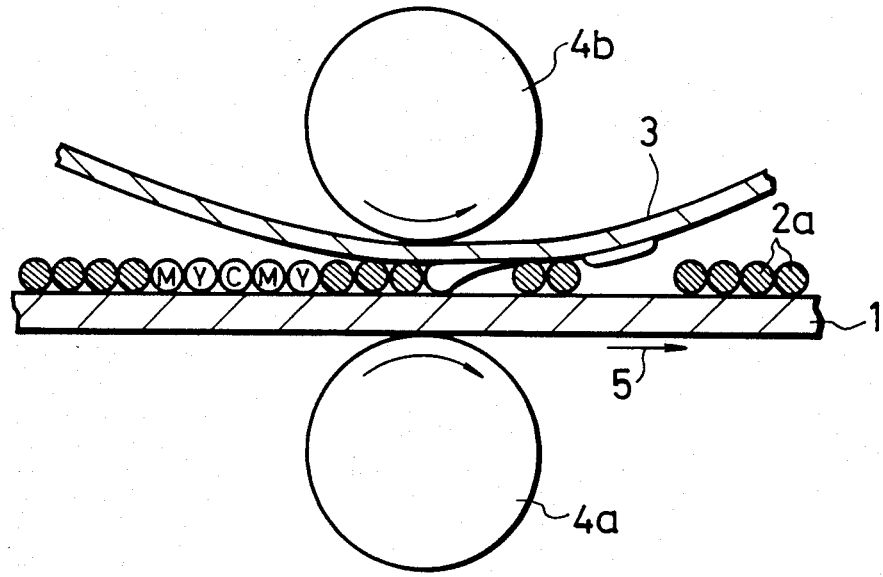
FIG. 3 is a schematic sectional view illustrating a developing apparatus according to the prior art.

In the known developing apparatus shown on FIG. 3, after irradiation of the photo-sensitive sheet 1, the latter is passed, in contact with a sheet 3 of developing paper, through the nip between pressure rollers 4a and 4b which rotate about axes at right angles to the direction of sheet travel therebetween, and which extend across the full width of the sheets 1 and 3. The pressure exerted by the rollers 4a and 4b on the sheets therebetween is sufficient to rupture the shells of the yellow, magenta and cyan microcapsules 2Y, 2M and 2C that have not been substantially hardened by irradiation with light of the corresponding wavelengths. The pressure between the rollers 4a and 4b further transfers the precursors of pigments from the ruptured microcapsules in the coating 2 of the photo-sensitive sheet 1 to the facing surface of the sheet 3 of developing paper which contains substances for developing the respective color pigments from the transferred precursors thereof. The pigments in three primary colors mix with each other on the sheet 3 of developing paper so as to form thereon the printed or developed color picture.

A pressure of 30 to 40 kg/mm$^2$ is required to rupture the microcapsules that have not been hardened in the exposing of the photo-sensitive sheet 1 and to ensure that the pigment precursors contained within the ruptured microcapsules are reliably transferred into intimate contact with the developing substances on the sheet 3 of developing paper. In the case of the known developing apparatus shown on FIG. 3, and in which the photo-sensitive sheet 1 and the sheet 3 of developing paper are pressed together between the rollers 4a and 4b rotating about axes extending perpendicular to the direction of sheet travel therebetween, such rollers contact the sheets at areas thereof extending across the entire widths of the latter. When the rollers 4a and 4b have diameters of 50 mm, the rollers have to be urged toward each other with a force of 57 kg for each cm of the roller length in order to provide the noted pressure required for rupture of the microcapsules. Therefore, if the known apparatus of FIG. 3 is to be employed for developing or printing a picture on a sheet of developing paper of the A4 size, that is, having a width of 21 cm, the corresponding rollers having axial lengths of at least 21 cm would have to be urged toward each other with a force of 1200 kg. It will be appreciated that, in order to apply such large force to the rollers 4a and 4b, the known developing apparatus must have a relatively complicated construction and be of large size.

Figure 4:
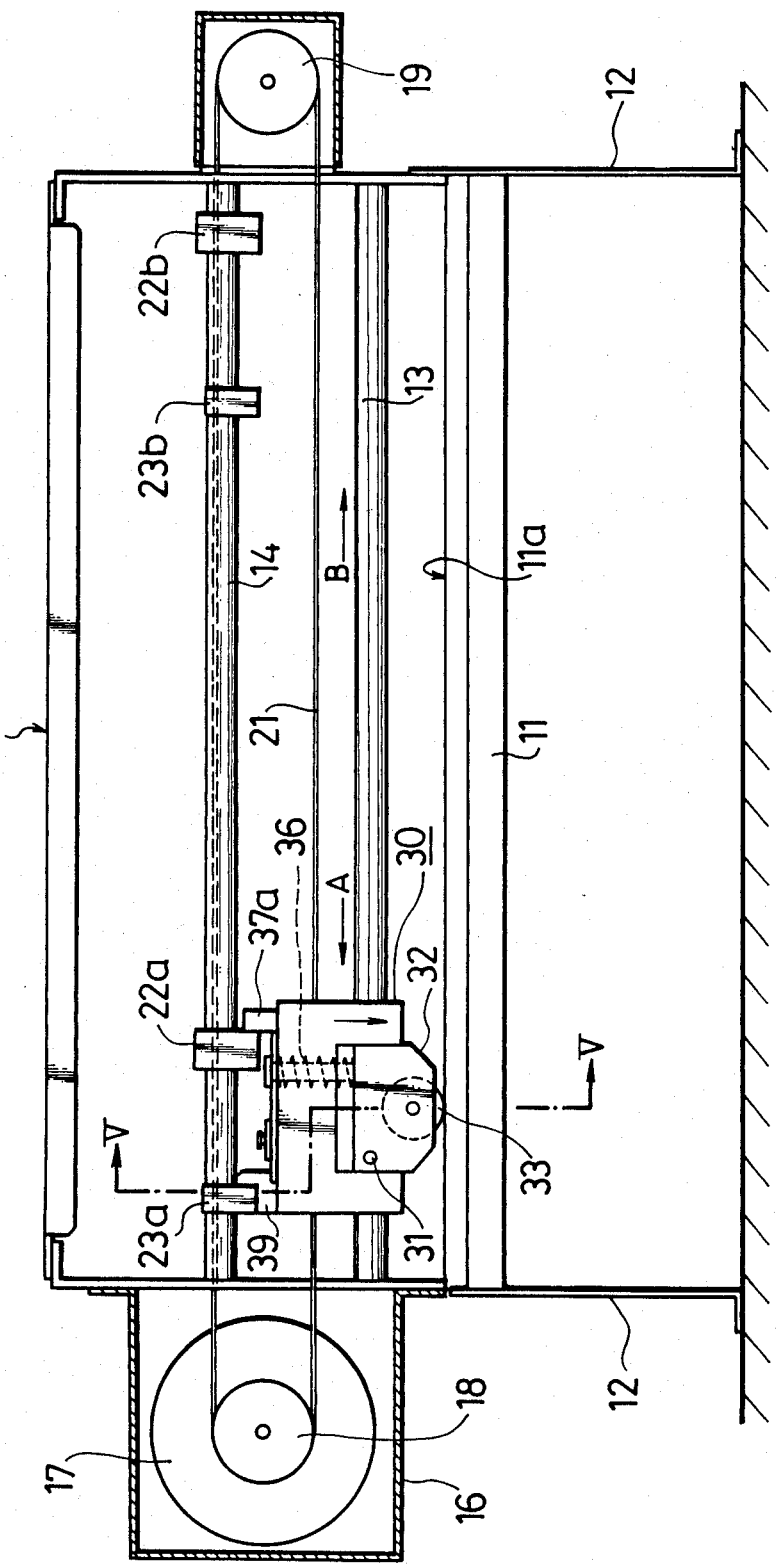
FIG. 4 is an elevational view of a developing apparatus according to an embodiment of the present invention, with a portion of the housing thereof being shown in cross section.
Figure 5:
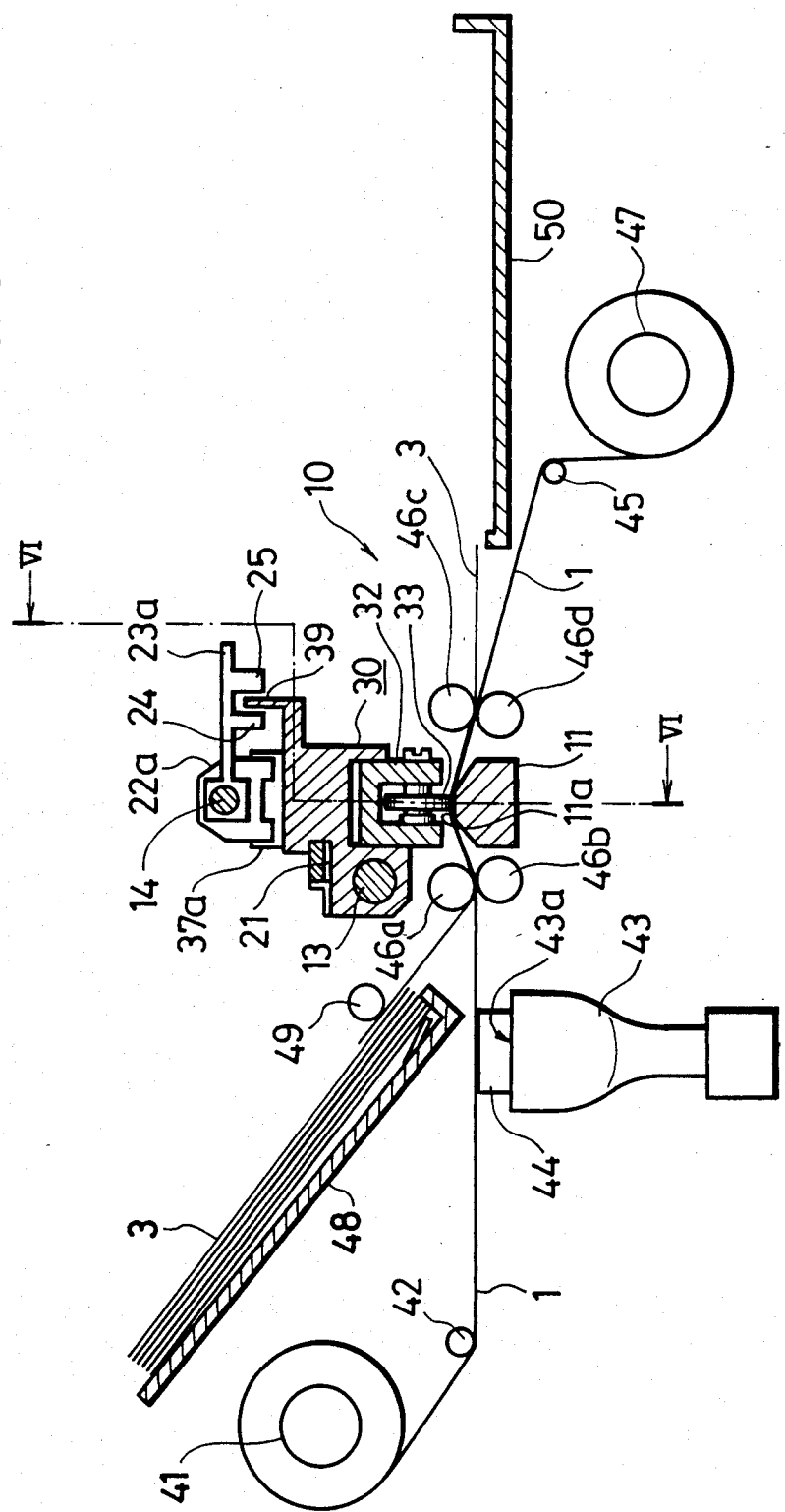
FIG. 5 is a sectional view taken along the line V—V on FIG. 4.

Referring now to FIGS. 4 and 5, it will be seen that a developing apparatus 10 according to an embodiment of the present invention is also intended to develop or print a color picture on a sheet 3 of developing paper which is irradiation or exposure of the latter. The developing apparatus 10 is shown to comprise a stage or platform 11 defining an upwardly facing back-up surface 11a which, in this embodiment, is flat or planar. The platform 11 extends laterally between the sides of a frame 12 of the developing apparatus 10 at approximately the central portion of the latter. A main guide rod 13 and an auxiliary guide rod 14 extend laterally parallel to each other above the back-up surface 11a of platform 11 and are supported, at their ends, in the sides of the frame 12.

A belt drive section 16 is mounted on one side of the frame 12 in the vicinity of the guide rods 13 and 14, and includes a reversible electric motor 17 and a pulley 18 coupled to the motor shaft (FIG. 4). Another pulley 19 is suitably mounted on the opposite side of the frame 12 adjacent the guide rods 13 and 14, and a drive belt 21 runs around the pulleys 18 and 19 and laterally across the frame 12 therebetween parallel to the guide rods 13 and 14.

A carriage 30 is slidably mounted on the main guide rod 13 and ends of the drive belt 21 are suitably secured to the carriage 30 so that the latter can be transported in directions indicated by the arrows A and B, respectively, and which are parallel to the axis of the guide rod 13 in response to the operation of the motor 17 in one direction or the other.

Figure 6:
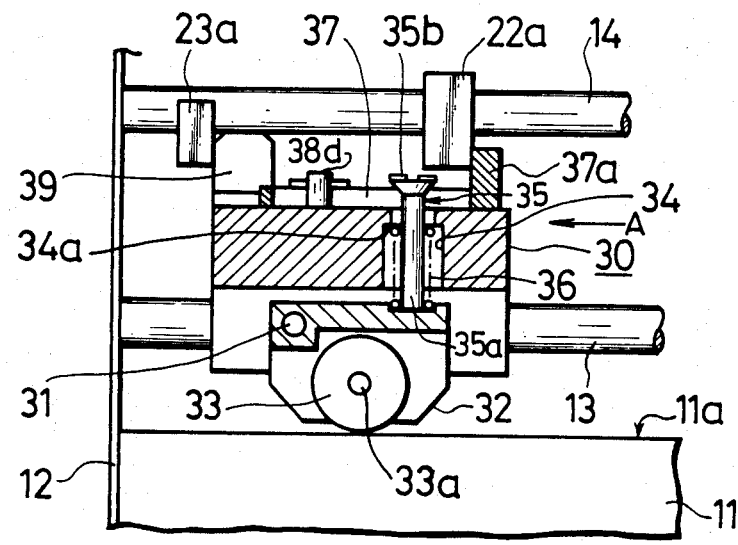
FIG. 6 is a detailed sectional view taken along the line VI—VI on FIG. 5 and showing the developing apparatus according to this invention in one phase of its operation.
Figure 7:
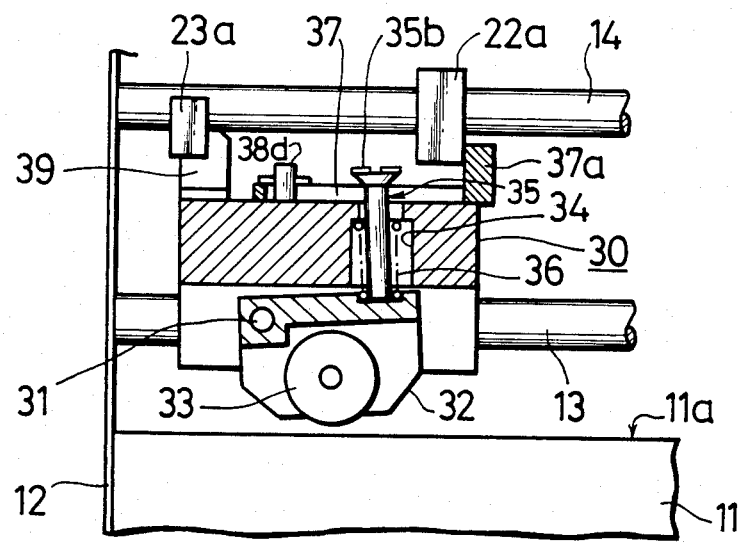
FIGS. 7, 8 and 9 are views similar to that of FIG. 6, but showing the developing apparatus in other respective phases of its operation.
Figure 8:
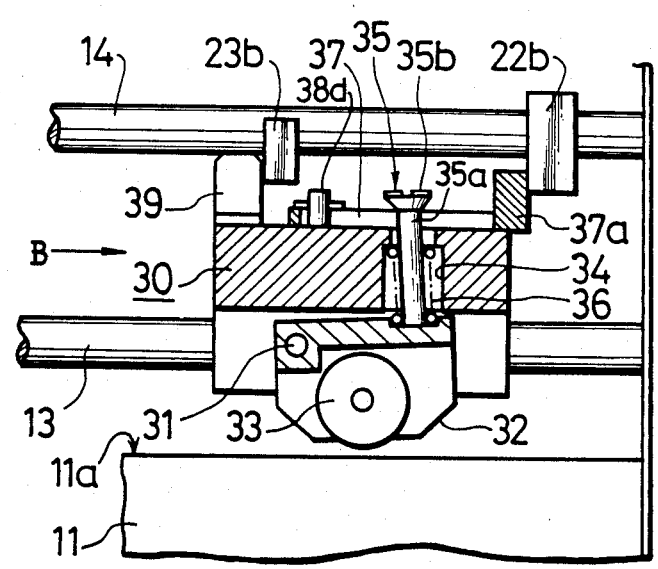
Figure 11:
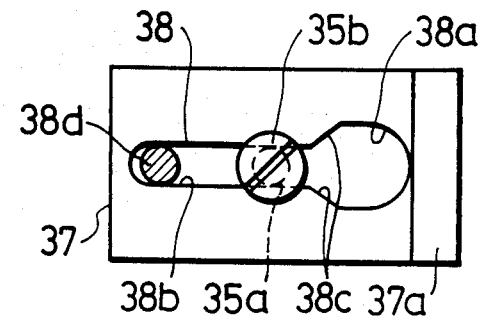

Referring now to FIG. 6, it will be seen that a roller support member 32 is mounted at the underside of the carriage 30 for rocking relative to the carriage about a pivot pin 31. A roller 33 having a relatively narrow or axle 33a carried by the support member 32, with the axis of such shaft 33a extending perpendicular to the directions A and B of the bodily movements of the carriage 30 along the guide rod 13. A bore 34 extends vertically through the carriage 30 above the roller support member 32 at a location spaced from the pivot 31, and a follower pin 35, extends upwardly from the roller support member 32 substantially axially through the bore 34. The follower pin 35, which may be in the form of a flat-head screw, includes a shaft portion 35a and a head 35b with a tapering underside. A helical compression spring 36 extends around the follower pin 35 and bears, at its opposite ends, against a downwardly facing shoulder 34a within the bore 34 and against a top surface of the support member 32 for urging the latter downwardly, and thereby pressing the roller 33 against the back-up surface 11a. An actuating plate 37 is mounted o top of the carriage 30 for limited slidable movements relative to the latter parallel to the directions A and B of movement of the carriage 30 along the guide rod 13. For example, as shown, the actuating plate 37 may be formed with an elongated slot 38 having a relatively wide end portion 38a and a relatively narrow major portion 38b which opens into the wide end portion 38a at diverging side edges 38c (FIG. 11). The relatively narrow major portion 38b of the slot 38 is laterally dimensioned to slidably receive a guide pin 38d mounted on the top of the carriage 30, and also to slidably receive the shaft portion 35a of the follower pin 35. Thus, the actuating plate 37 is guided in its limited slidable movements relative to the carriage 30 between a first position (FIGS. 6 and 9) and a second position (FIGS. 7 and 8).

The shaft 35a of the follower pin 35 is longitudinally dimensioned so that, when the actuating 37 is in its second position (FIGS. 7 and 8) for locating the follower pin 35 within the relatively narrow portion 38b of the slot 38, the tapering underside of the head 35b of the follower pin 35 rides on the top surface of the plate 37 and thereby raises the roller support member 32 against the force of the spring 36 for holding the roller 33 away from the back-up surface 11a. On the other hand, when the actuating plate 37 is moved to its first position (FIGS. 6 and 9), the shaft of the follower pin 35 moves into the relatively wide end portion 38a of the slot 38, or at least into the region between the diverging side edges 38c of the slot (FIG. 10), so as to permit the follower pin 35 to move downwardly under the influence of the spring 36 acting on the support member 32, with the result that the roller 33 can be pressed against the back-up surface 11a by the force of the spring 36.

The actuating plate 37 is formed with an upstanding rim 37a at the end thereof adjacent the relatively wide end portion 38a of the slot 38. The carriage 30 has a light shield 3 directed upwardly from its top surface (FIGS. 6–9) at the end of the carriage remote from the upstanding rim 37a on actuating plate 37.

stop members 22a and 22b are slidably mounted on the opposite end portions, respectively, of the auxiliary guide rod 14 and are suitably secured, as by set screws (not shown), at adjusted position along the respective end portions of such guide rod. The stop members 22a and 22b are selectively engagable by the upstanding rim 37a on the actuating plate 37, for example, as in FIGS. 6 and 7 and in FIGS. 8 and 9, respectively, and are effective to displace the actuating plate 37 from one to the other of its first and second positions on the carriage 30, as hereinafter described in detail. Photo-sensing devices 23a and 23b are similarly adjustably mounted on the opposite end portions of the auxiliary guide rod 14. As shown on FIG. 5 in respect to the photo-sensing device 23a, each of the photo-sensing devices 23a and 23b includes a light source 24 and a photo cell 25 disposed at opposite sides of the path of travel of the light shield 39 on the carriage 30 so that the light path from the source 24 to the respective photo-cell 25 is interrupted by the shield 39 at a predetermined position of the carriage 30, and hence of the roller 33, in respect to the photo-sensing device 23a or 23b.

In the illustrated embodiment, the photo-sensing devices 23a and 23b are located at the same predetermined distances from the stop members 22a and 22b, respectively, and are preferably adjustable with the stop members 22a and 22b along the respective end portions of the guide rod 14. Furthermore, the distance between each of the photo-sensing devices 23a and 23b and the respective stop member 22a or 22b is approximately equal to the distance between the light shield 39 and the upstanding rim 37a. Moreover, as viewed disposed to the left of the respective stop member 22a or 22b. When, in the course of movement of the carriage 30 in the direction A or B, either one of the photo-sensing devices 23a and 23b detects the arrival of the carriage 30 at the respective position along the guide rod 13 by sensing that the light shield 39 on the carriage 30 interrupts the passage of light from the respective light source 24 to the respective photo cell 25, the direction of operation of the reversible electric motor 17 is suitably reversed so as to drive the carriage 30 along the guide rod 13 in the opposite direction B or A.

Referring now to FIG. 5, it will be seen that, in the embodiment of the present invention there illustrated, the photo-sensitive sheet 1 and a sheet 3 of developing paper are transported in contact with each other in a predetermined direction of sheet travel across the back-up surface 11a, that is, in a direction perpendicular to the directions of the movements of the roller 33 with the carriage 30 along the guide rod 13. As shown, the photo-sensitive sheet 1 may be in the form of a web which is unwound from a supply reel 41 and then lead under a guide roller 42 into a horizontal run extending between feed rollers 46a and 46b at the entry side of the platform 11. A cathode-ray tube 43 is disposed below the horizontal run of the web of photo-sensitive sheet material 1 between guide roller 42 and feed rollers 46a and 46b to provide a light image corresponding to a picture to be developed and which is emitted from a display surface 43a through a multi-lens array 44 closely underlying the photo-sensitive sheet cathode-ray tube 43 is projected by the lens array 44 through the light transmitting base of the web of photo-sensitive sheet material 1 for irradiating the microcapsule-containing coating 2 which, in the illustrated embodiment is at the top thereof.

The feed rollers 46a and 46b transport the web of photo-sensitive sheet material 1 across the back-up surface 11a of the platform 11 in the predetermined direction perpendicular to the directions of the bodily movements of the roller 33 with the carriage 30 along the guide rod 13. After traveling across the back-up surface 11a, the web of photo-sensitive material 1 passes between exit feed rollers 46c and 46d and then over a guide roller 45 to a take-up reel 47 on which the web of photo-sensitive sheet material is rewound.

A developing paper supply tray 48 is located above the path of travel of the web of photo-sensitive sheet material 1 between the guide roller 42 and the entry feed rollers 46a and 46b and contains a stack of developing paper sheets 3. The developing paper sheets 3 in the stack on the tray 48 are suitably transported therefrom one-by-one, for example, by means of a roller 49, so as to be fed into the nip between the entry feed rollers 46a and 46b in superposed relation with the previously irradiated or exposed photo-sensitive sheet material 1. The sheet 3 of developing paper is transported with the underlying photo-sensitive sheet material 1 across the back-up surface 11a, and then between the exit feed rollers 46c and 46d, whereupon the developing paper sheet 3 is suitably stripped or separated from the web of photo-sensitive sheet material 1 and received by a take-up tray 50.

In the developing apparatus 10 embodying this invention, the sheets 3 of developing paper and the web of photo-sensitive sheet material 1 are transported together across the back-up surface, as by the entry feed rollers 46a and 46b and the exit feed rollers 46c and 46d, in an intermittent manner so as to alternate periods of incremental movement and of rest, respectively. Following each incremental movement of a sheet 3 of developing paper together with the web of photo-sensitive material 1 through a predetermined small distance, the drive motor 17 is suitably operated to effect a single reciprocating movement of the carriage 30 along the guide rod 13, as hereinafter described in detail.

The operation of the developing apparatus 10 in accordance with an embodiment of this invention will now be described in detail:

As the web of the photo-sensitive sheet material 1 is transported intermittently or in a step-by-step manner from the supply reel 41 and across the back-up surface 11a, the photo-sensitive sheet material 1 is irradiated in a similar step-by-step manner by the cathode-ray tube 43. In other words, during each period of rest of the intermittently transported web of photo-sensitive sheet material 1, the electron beam R beams of the cathode-ray tube 43 scan a relatively narrow, laterally extending stripe-like area of the display surface 43a so as to irradiate a similarly narrow, stripe-like area extending across the web of photo-sensitive sheet material 1. During the next period of incremental movement of the web, the photo-sensitive sheet material 1 is advanced a distance corresponding to the pitch or width of the stripe-like area that has been irradiated, whereupon, during the next period of rest, a successive stripe-like area of the web of photo-sensitive sheet material 1 is irradiated with a corresponding stripe-like area of the display surface 43a. In such step-by-step manner, a portion of the web of photo-sensitive sheet material 1 is irradiated by a light image corresponding to the color picture to be developed. Following such irradiation, a sheet 3 of developing paper is transported from the tray 48 onto the web of photo-sensitive sheet material 1 so as to be registered with the portion of the latter which has been irradiated with the light image. Thereafter, as the web of photo-sensitive sheet material 1 and a sheet 3 of developing paper superposed thereon in registration with the portion irradiated with a light image of the color picture to be developed are incrementally transported across the back-up surface 11a, the carriage 30 is reciprocated once along the guide rod 13 during each period of rest of the transported sheets. During such reciprocatory movement of the carriage 30 in one direction, for example, in the direction of the arrow A on FIG. 4, the roller 33 is urged toward the back-up surface 11a. Thus, the sheet 3 of developing paper and the web of photo-sensitive sheet material 1 in contact with each other between the roller 33 and the back-up surface 11a are thereby pressed together along a relatively narrow stripe-like area corresponding to the rolling path of the narrow periphery of the roller 33. During the return movement of the carriage 30, for example, in the direction of the arrow B along the guide rod 13, and during which the incremental transport of the sheet 3 of developing paper and the web of photo-sensitive sheet material 1 across the back-up surface 11a is effected, the roller 33 is raised or moved away from the back-up surface 11a.

The manner in which the foregoing movements of the roller 33 are effected will now be more specifically described with reference to FIGS. 6-9.

Assuming that the carriage 30 is nearing the end of its operative movement in the direction of the arrow A with the actuating plate 37 in its first position so as to permit the spring 36 to urge the roller 33 against the back-up surface 11a with the photo-sensitive and developing paper sheets 1 and 3 therebetween, the upstanding rim 37a on the actuating plate 37 comes into contact with the stop member 22a adjustably fixed on the guide rod 14. Thereafter, the concluding movement of the carriage 30 in the direction of the arrow A by the operation of the drive motor 17 is accompanied by the shifting of the actuating plate 37 to its second position relative to the carriage 30, as on FIG. 7, with the result that the tapering undersurface of the head 35b of the follower pin 35 cooperates with the diverging edges 38c of the slot 38 for raising the pin 35 and thereby upwardly rocking the roller support member 32. Thus, the roller 33 is moved upwardly or away from the back-up surface 11a so as to free or clear the contacting photo-sensitive and developing paper sheets 1 and 3 therebetween. Further, when the carriage 30 attains the position shown on FIG. 7, the light shield 39 on carriage 30 intercepts the light path of the photo-sensing device 23a and, as a result thereof, the direction of operation of the motor 17 is suitably changed-over. Thus, upon attaining the position shown o FIG. 7, the carriage 30 is thereafter moved or driven in the return direction indicated by the arrow B on FIG. 8 with the roller 33 being maintained in its raised position away from the back-up surface 11a in accordance with the actuating plate 37 remaining in its second position relative to the carriage 30.

As earlier noted, an incremental movement of the photo-sensitive sheet 1 and the developing paper sheet 3 is suitably effected by the feed rollers 46a–46d during each interval when the roller 33 is raised or held away from the back-up surface 11a, that is, during each return movement of the carriage 30 in the direction of the arrow B.

As the carriage 30 nears the end of its return movement in the direction of the arrow B, the upstanding rim 37a on the actuating plate 37 comes into contact with the adjustably fixed stop member 22b, for example, as shown on FIG. 8. Therefore, during the final further movement of the carriage 30 in the direction of the arrow B, the engagement of the rim 37a with the stop member 22b causes displacement of the actuating plate 37 to its first position relative to the carriage 30, as shown on FIG. 9. Such displacement of the actuating plate 37 to its first position, as on FIGS. 9 and 10, releases the head 35b of the follower pin 35 from engagement with the edges of the relatively narrow slot portion 38b, with the result that spring 36 can move the follower pin 35 and the roller support member 32 downwardly, and thereby urge roller 33 against the back-up surface 11a with the sheets 1 and 3 therebetween. The final movement of the carriage 30 to the position shown on FIG. 9 also causes the shield 39 thereon to intercept the light path in the photo-sensing device 23b and, in response thereto, the direction of operation of the motor 17 is reversed for causing the drive belt 21 to thereafter drive the carriage 30 in the direction of the arrow A on FIGS. 4 and 6 from the position shown on FIG. 9 to the position shown on FIG. 7. During such movement of the carriage 30 in the direction of the arrow A from the position shown on FIG. 9 at least to the position shown on FIG. 6, the roller 33 is urged against the back-up surface 11a so that the roller 33 applies pressure to the contacting photo-sensitive sheet 1 and developing paper sheet 3 along a laterally extending stripe-like area extending across the contacting sheets and corresponding, in width, to the axial width of the peripheral surface of the roller 33. It will be appreciated that, during such application of pressure by the roller 33 as the carriage 30 moves from the position of FIG. 9 to the position of FIG. 6, the contacting photo-sensitive sheet 1 and developing paper sheet 3 remain at rest on the back-up surface 11a.

Figure 9:
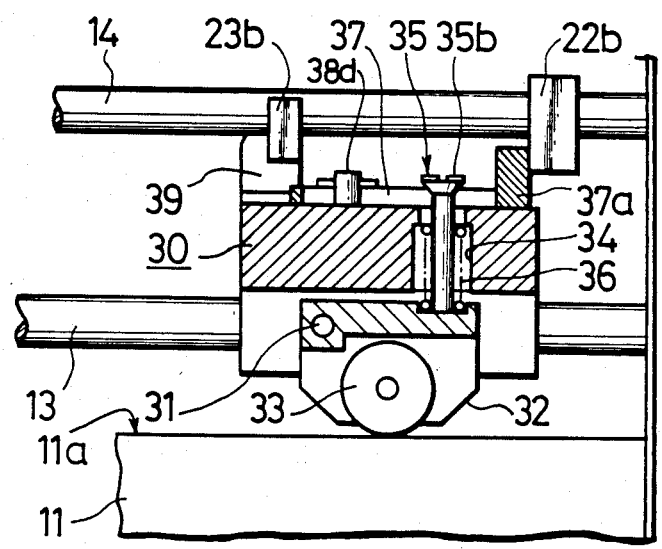
Figure 10:
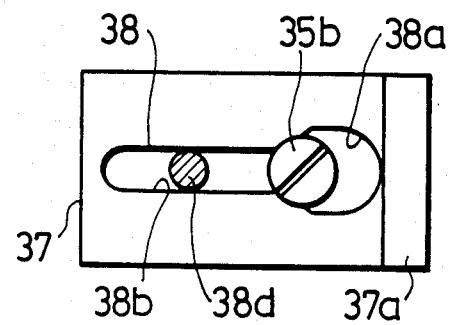
FIGS. 10 and 11 are plan views showing two different positions of an actuating plate included in the illustrated embodiment of the invention for controlling the movements of a roller therein toward and away from a back-up surface.

At the completion of the operative movement of the carriage 30 in the direction of the arrow A from the position of FIG. 9 to the position of FIG. 6, the rim 37a again engages the adjustably fixed stop member 22a for moving the actuating plate 37 to its second position and thereby raising the roller 33 away from the back-up surface 11a in response to the final movement of the carriage 30 to the position shown on FIG. 7. Further, as previously noted, when the carriage 30 attains the position of FIG. 7, the shield 39 intercepts the light path in the photo-sensing device 23a for causing another reversal of the direction of drive of the carriage 30.

It will be appreciated that the above described movements of the carriage 30 and of the roller 33 mounted thereon are cyclically repeated as the sheets 1 and 3 are transported step-by-step. Thus, roller 33 applies pressure along successive stripe-like areas extending across the contacting photo-sensitive sheet 1 and developing paper sheet 3 as the latter are transported intermittently across the back-up surface 11a. Thereby, a color picture irradiated on the photo-sensitive sheet 1 by the cathode-ray tube 43 is printed or developed on a sheet 3 of the developing paper which is then stripped or separated from the sheet 1 and ejected into the tray 50.

It will be seen that, in the described embodiment of this invention, the roller 33 for pressing together the sheets 1 and 3 moves with the carriage 30 in the directions of the arrows A and B, that is, in directions perpendicular to the direction of sheet travel across the back-up surface 11a. Further, the width of the peripheral surface of the roller 33 at which the latter exerts its pressing action against the sheets 1 and 3 on the back-up surface 11a is relatively small in comparison to the distance across the sheets 1 and 3, that is, the distance the roller 33 moves from the position shown on FIG. 9 to the position shown on FIG. 6. Therefore, the contact area of the roller 33 with the sheets 3 and 1 against the back-up surface 11a is very small, with the result that the requisite contact pressure of 30 to 40 kg/mm$^2$ for rupturing the unhardened microcapsules of the sheet 1 and for ensuring the reliable transfer of the released pigment precursors into adequate contact with the developing substances of the sheet 3 can be achieved by means of a relatively small and light helical compression spring 36. Since it is unnecessary to apply a large force for urging the roller 33 toward the back-up surface 11a, the structure of the developing apparatus 10 can be simplified and made compact. Further, since the roller 33 carried by the rockable roller support member 32 is in rolling contact with the superposed sheets 1 and 3 against the back-up surface 11a during the operative movement of the carriage 30 from the position shown on FIG. 9 to the position shown on FIG. 6, the roller 33 performs its necessary function of rupturing the unhardened microcapsules of the sheet 1 and of transferring the released pigment precursors to the developing paper sheet 3 in a smooth and relatively quiet manner. Therefore, noisy operation of the apparatus 10 is avoided.

Furthermore, in the described embodiment of the invention, the stop members 22a and 22b and the photo-sensing devices 23a and 23b can be adjusted along the auxiliary guide rod 14 on which they are mounted. By means of such adjustment, it is possible to change the width of the sheets 1 and 3 across which the roller 33 exerts pressure against the back-up surface 11a, and hence the width of the area at which a picture is printed or developed.

In order to appreciate the advantage of such adjustment of the stop members 22a and 22b and the photo-sensing devices 23a and 23b, it is to be noted that, if the sheet 3 of developing paper extends over opposite side portions of the photo-sensitive sheet 1 which have not been irradiated, that is, which extend laterally beyond the side margins of the light image of the picture to be developed, and the sheets 1 and 3 are pressed together by the roller 33 across the entire width of the sheets 1 and 3, the opposite side margins of the sheet 3 of developing paper extending beyond the developed color picture will be developed black. Such black margins are not desirable. However, by suitably adjusting the locations of the stop members 22a and 22b and of the photo-sensing devices 23a and 23b so as to be consistent with the width of the photo-sensitive sheet 1 which is to be irradiated with the light image corresponding to the color picture to be developed, only the light irradiated portion of the photo-sensitive sheet 1 is pressed together with the sheet 3 of developing paper, with the result that the opposite side portions of the developing paper extending beyond the color picture are not developed.

Figure 5A:
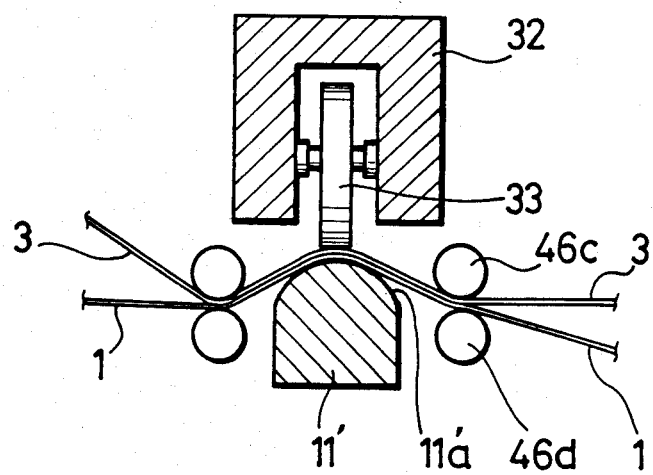
FIG. 5A is a fragmentary sectional view similar to a portion of FIG. 5, but on an enlarged scale, and illustrating another embodiment of the present invention.

In the previously described embodiment of the invention, the back-up surface 11a of the platform 11 is flat or planar, and the contact area of the roller 33 with the sheets 1 and 3 against the back-up surface 11a is made small by providing the peripheral surface of the roller 33 with a relatively small axial width. However, if desired, and as shown specifically on FIG. 5A, a platform 11' employed in place of the platform 11 may be provided with a convex back-up surface 11'a having a rectilinear generator extending parallel to the direction of movement of the roller 33 with the carriage 30 along the guide rod 13. Such arrangement illustrated on FIG. 5A further reduces the contact area of the roller 33 with the sheets 1 and 3 against the back-up surface 11'a so that even a smaller force can be exerted by the spring 36 for obtaining the requisite contact pressure between the sheets 1 and 3. The foregoing advantage of the arrangement shown in FIG. 5A can be similarly obtained with the flat back-up surface 11a of FIG. 5 by providing the roller 33 with a convex peripheral surface. Of course, when thus reducing the contact area of the roller 33 with the sheets 1 and 3 against the back-up surface 11a or 11'a, each incremental movement of the sheets 1 and 3 during the intermittent transport thereof across the back-up surface is correspondingly reduced.

Although preferred embodiments of the invention have been described in detail herein with reference to the accompanying drawings, it is to be understood that the invention is not limited to those precise embodiments, and that various changes and modifications can be effected therein by one skilled in the art without departing from the scope or spirit of the invention as defined in the appended claims.

What is claimed is:

1. An apparatus for developing a picture on a sheet of developing paper from a photo-sensitive sheet of a type which develops said picture upon the pressing together of said sheet of developing paper and said photo-sensitive sheet, said apparatus comprising:

means defining a back-up surface;
   means for transporting said sheet of developing paper and said photo-sensitive sheet in contact with each other in a predetermined direction of sheet travel across said back-up surface;
   a rotatable roller disposed in opposing relation to said back-up surface and having an axis of rotation extending parallel to said predetermined direction of sheet travel;
   means mounting said roller for bodily movements toward and away from said back-up surface and parallel to the back-up surface in directions perpendicular to said predetermined direction of sheet travel; and
   means for transporting said roller relative to said back-up surface in one of said directions perpendicular to said predetermined direction of sheet travel while urging said roller toward said back-up surface with said sheet of developing paper and said photo-sensitive sheet being in contact with each other between said roller and back-up surface so as to be pressed together thereby.

2. An apparatus according to claim 1; further comprising means for irradiating said photo-sensitive sheet with a light image of the picture to be developed in advance of said pressing together of said sheet of developing paper and said photo-sensitive sheet.

3. An apparatus according to claim 2; in which said photo-sensitive sheet has a surface comprised of photo-sensitive microcapsules which are selectively hardened by said light image.

4. An apparatus according to claim 1; in which said roller has a peripheral surface of a width which is small relative to a distance said roller is transported in said one direction perpendicular to said predetermined direction of sheet travel.

5. An apparatus according to claim 4; in which said back-up surface is flat.

6. An apparatus according to claim 1; in which said back-up surface is convex and has a rectilinear generatrix extending parallel to said one perpendicular direction in which said roller is transported so that said roller and back-up surface press together said sheet of developing paper and said photo-sensitive sheet at a small contact area.

7. An apparatus according to claim 1, in which said means for transporting the developing paper and photo-sensitive sheets operates intermittently so as to alternate periods of incremental movement and of rest, respectively, of said sheets; and said means for transporting said roller operates, during each of said periods of rest, to transport said roller in said one direction perpendicular to said direction of sheet travel while urging said roller toward said back-up surface, whereupon said means for transporting said roller operates to return the roller in the other of said directions perpendicular to said direction of sheet travel; and further comprising means for moving said roller away from said back-up surface during each of said periods of incremental movement of the sheets and during said return of the roller in said other direction perpendicular to said direction of sheet travel.

8. An apparatus according to claim 7, in which said means for transporting the roller includes drive means reversible for transporting said roller in said one direction and said other direction perpendicular to said direction of sheet travel, and means for detecting opposite end positions of said roller during said transporting of the roller in said one direction and said other direction, respectively, and for reversing said drive means upon detection of each of said opposite end positions.

9. An apparatus according to claim 8; further comprising means for adjusting the location of at least one of said opposite end positions.

10. An apparatus according to claim 8; in which said means mounting said roller includes guide means extending parallel to said directions perpendicular to the direction of sheet travel, a carriage moveable along said guide means, a roller support member having said roller rotatable thereon and being mounted on said carriage for said movement of the roller toward and away from said back-up surface, and spring means acting on said roller support member for said urging of the roller toward said back-up surface; and said means for moving the roller away from said back-up surface includes actuating means on said carriage and roller support member having an engaged condition for moving the roller away from the back-up surface against the force of said spring means and a disengaged condition in which said spring means is free to urge said roller toward the back-up surface, and means for establishing said disengaged and engaged conditions of the actuating means in response to final transporting movements of said roller in said one direction and said other direction, respectively, to the respective opposite end positions.

11. An apparatus according to claim 1; further comprising means for detecting a position of said roller in said movements thereof in said directions perpendicular to said direction of sheet travel.

12. An apparatus according to claim 11; in which said means mounting said roller includes guide mean extending parallel to said directions perpendicular to said direction of sheet travel, a carriage reciprocally movable along said guide means, and a roller support member rotatably supporting said roller and connected with said carriage for permitting said movements of the roller toward and away from said back-up surface; and said means for detecting a position of said roller includes photo-sensor means mounted on said guide means, and a light shielding member on said carriage for interrupting a light beam otherwise received by said photo-sensor means when said roller is in said position to be detected.

13. An apparatus according to claim 12; further comprising spring means acting on said roller support member for said urging of the roller toward said back-up surface; and means for moving said roller away from the back-up surface including an actuating plate mounted on said carriage for limited slidable movements relative to the latter in said directions perpendicular to said direction of sheet travel between first and second positions, a follower member extending from said roller support member and engaging said actuating plate, said actuating plate and follower member cooperating to permit said spring means to move said roller toward said back-up surface when said actuating plate is in said first position thereof and to displace said roller support member for moving said roller away from said back-up surface when said actuating plate is said second position thereof, and a stop member mounted on said guide means adjacent said photo-sensor means and being engageable with said actuating plate for moving the latter from one to another of said first and second positions relative to said carriage during a final increment of movement of said carriage for disposing said roller in said position of the latter to be detected by said photo-sensor means.

14. An apparatus according to claim 13; in which said photo-sensor means and said stop member are adjustable along said guide means.

* * * * *